(12) United States Patent
Yim et al.

(10) Patent No.: US 9,929,098 B2
(45) Date of Patent: Mar. 27, 2018

(54) COPPER VIA WITH BARRIER LAYER AND CAP LAYER

(71) Applicant: Samsung Electronics Co., Ltd., Suwon-si, Gyeonggi-do (KR)

(72) Inventors: Tae-Jin Yim, Yongin-si (KR); Sang-Hoon Ahn, Goyang-si (KR); Thomas Oszinda, Hwaseong-si (KR); Jong-Min Baek, Seoul (KR); Byung Hee Kim, Seoul (KR); Nae-In Lee, Seoul (KR); Kee-Young Jun, Seongnam-si (KR)

(73) Assignee: SAMSUNG ELECTRONICS CO., LTD. (KR)

(*) Notice: Subject to any disclaimer, the term of this patent is extended or adjusted under 35 U.S.C. 154(b) by 0 days.

(21) Appl. No.: 15/048,998

(22) Filed: Feb. 19, 2016

(65) Prior Publication Data
US 2016/0293552 A1  Oct. 6, 2016

(30) Foreign Application Priority Data
Mar. 30, 2015 (KR) .................. 10-2015-0044602

(51) Int. Cl.
*H01L 23/532* (2006.01)
*H01L 23/528* (2006.01)
*H01L 21/768* (2006.01)

(52) U.S. Cl.
CPC .. *H01L 23/53238* (2013.01); *H01L 21/76826* (2013.01); *H01L 21/76831* (2013.01); *H01L 21/76846* (2013.01); *H01L 21/76849* (2013.01); *H01L 21/76867* (2013.01); *H01L 23/5283* (2013.01); *H01L 23/53295* (2013.01)

(58) Field of Classification Search
CPC .......... H01L 23/53238; H01L 23/5283; H01L 23/53295
See application file for complete search history.

(56) References Cited

U.S. PATENT DOCUMENTS

| | | | |
|---|---|---|---|
| 7,125,793 B2 | 10/2006 | Liou et al. | |
| 7,196,420 B1 * | 3/2007 | Burke | H01L 21/76807 257/734 |
| 7,329,956 B1 | 2/2008 | Yu et al. | |
| 7,338,893 B2 | 3/2008 | Engbrecht et al. | |
| 7,498,242 B2 | 3/2009 | Kumar et al. | |
| 7,544,608 B2 | 6/2009 | Yang et al. | |
| 7,564,136 B2 | 7/2009 | Yeh et al. | |

(Continued)

FOREIGN PATENT DOCUMENTS

KR  101063591 B1  9/2011

*Primary Examiner* — Peter Bradford
(74) *Attorney, Agent, or Firm* — Renaissance IP Law Group LLP

(57) ABSTRACT

A semiconductor device includes an insulating interlayer on a first region of a substrate. The insulating interlayer has a recess therein and includes a low-k material having porosity. A damage curing layer is formed on an inner surface of the recess. A barrier pattern is formed on the damage curing layer. A copper structure fills the recess and is disposed on the barrier pattern. The copper structure includes a copper pattern and a copper-manganese capping pattern covering a surface of the copper pattern. A diffusion of metal in a wiring structure of the semiconductor device may be prevented, and thus a resistance of the wiring structure may decrease.

19 Claims, 13 Drawing Sheets

(56) References Cited

U.S. PATENT DOCUMENTS

| | | | |
|---|---|---|---|
| 7,842,518 B2 | 11/2010 | Miyajima | |
| 7,888,253 B2* | 2/2011 | Usui | H01L 21/76831 257/751 |
| 8,101,507 B2 | 1/2012 | Asako et al. | |
| 2008/0108153 A1* | 5/2008 | Miyajima | H01L 21/02126 438/4 |
| 2008/0122109 A1* | 5/2008 | Yang | H01L 21/7682 257/774 |
| 2011/0006429 A1* | 1/2011 | Liu | H01L 21/76831 257/751 |
| 2011/0116299 A1* | 5/2011 | Obayashi | G11C 17/18 365/96 |
| 2013/0341768 A1 | 12/2013 | Huang et al. | |
| 2016/0336386 A1* | 11/2016 | Saito | H01L 23/53238 |

* cited by examiner

COPPER VIA WITH BARRIER LAYER AND CAP LAYER

CROSS-REFERENCE TO RELATED APPLICATION

This application claims priority under 35 USC § 119 to Korean Patent Application No. 10-2015-0044602, filed on Mar. 30, 2015 in the Korean Intellectual Property Office (KIPO), the contents of which are herein incorporated by reference in their entireties.

TECHNICAL FIELD

Example embodiments of the inventive concepts relate to semiconductor devices and methods of manufacturing the same. More particularly, example embodiments relate to semiconductor devices having a copper wiring structure and methods of manufacturing the same.

BACKGROUND

Copper wiring structures may be formed in an insulating interlayer having a low dielectric constant. When the copper wiring structures are formed, it is not easy to prevent or reduce the diffusion of copper while keeping the low-k characteristics of the insulating interlayer.

SUMMARY

Example embodiments of the inventive concepts provide a semiconductor device including a wiring structure having good electrical characteristics.

According to example embodiments of the inventive concepts, there may be provided a semiconductor device. The semiconductor device may include an insulating interlayer, a damage curing layer, a barrier pattern, and a copper structure. The insulating interlayer may be formed on a substrate. The insulating interlayer may have a recess therein and includes a low-k material having porosity. The damage curing layer may be formed on an inner surface of the recess. The barrier pattern may be formed on the damage curing layer. The copper structure may fill the recess having the barrier pattern therein. The copper structure may include a copper pattern and a copper-manganese capping pattern covering a surface of the copper pattern.

In example embodiments, the insulating interlayer may include Si—O bonds, and some oxygen atoms of the Si—O bonds in the insulating interlayer may be substituted by a methyl group (CH3).

In example embodiments, the damage curing layer may have porosity lower than the porosity of the insulating interlayer.

In example embodiments, the damage curing layer may include an insulating material having Si—C bonds, and a density of the Si—C bonds in the damage curing layer may be higher than a density of Si—C bonds in the insulating interlayer.

In example embodiments, a portion of the barrier pattern on a sidewall of the recess may have a thickness less than a thickness of a portion of the barrier pattern on a bottom of the recess.

In example embodiments, the copper-manganese capping pattern may have a thickness of about 0.1 nm to about 10 nm.

In example embodiments, a portion of the copper-manganese capping pattern on an upper central portion of the copper pattern may have a first thickness, and a portion of the copper-manganese capping pattern on an upper edge portion of the copper pattern may have a second thickness greater than the first thickness.

In example embodiments, the copper-manganese capping pattern may be formed on an upper surface of the copper pattern.

In example embodiments, the copper-manganese capping pattern may be formed on an upper surface and a sidewall of the copper pattern.

In example embodiments, an amount of manganese in a portion of the copper-manganese capping pattern on the sidewall of the copper pattern may be less than an amount of manganese in a portion of the copper-manganese capping pattern on the upper surface of the copper pattern.

According to example embodiments of the inventive concepts, there may be provided a semiconductor device. The semiconductor device may include an insulating interlayer, a barrier pattern, and a copper structure. The insulating interlayer having a recess may be formed on a substrate. The insulating interlayer may include a low-k material having porosity. The barrier pattern may be formed on a sidewall and a bottom of the recess. A portion of the barrier layer on a sidewall of the recess may have a thickness less than a thickness of a portion of the barrier layer on a bottom of the recess. The copper structure may fill the recess having the barrier pattern therein. The copper structure may include a copper pattern and a copper-manganese capping pattern covering a surface of the copper pattern.

In example embodiments, the copper pattern may include manganese of 0.005 wt % to 5 wt %, and the copper-manganese capping pattern may include manganese having a weight percentage higher than a weight percentage of manganese in the copper pattern.

In example embodiments, the copper-manganese capping pattern may include manganese of 0.1 wt % to 80 wt %.

In example embodiments, the copper-manganese capping pattern may be formed on an upper surface, a sidewall and a bottom of the copper pattern. A portion of the copper-manganese capping pattern on an upper central portion of the copper pattern may have a first thickness, and a portion of the copper-manganese capping pattern on an upper edge portion of the copper pattern may have a second thickness greater than the first thickness.

In example embodiments, a damage curing layer may be further formed between of the barrier pattern and the insulating interlayer. The damage curing layer may have porosity lower than the porosity of the insulating interlayer.

According to example embodiments of the inventive concepts, there may be provided a semiconductor device. The semiconductor device may include a first insulating interlayer, a second insulating interlayer, a damage curing layer, and a copper structure. The first insulating interlayer may be formed on a substrate. The first insulating interlayer may heave a via hole therethrough. The second insulating interlayer may include a low-k material having porosity and has a trench therethrough. The trench may be in communication with the via hole and extending in a first direction. The damage curing layer may be formed on inner surfaces of the via hole and the trench. The barrier pattern may be formed on the damage curing layer. The copper structure may be formed on the barrier pattern to fill the via hole and the trench on the barrier pattern. The copper structure may include a copper pattern and a copper-manganese capping pattern covering a surface of the copper pattern.

In example embodiments, the damage curing layer may have porosity lower than the porosities of the first and second insulating interlayers.

In example embodiments, the damage curing layer may include an insulating material having Si—C bonds, and a density of the Si—C bonds in the damage curing layer may be higher than a density of Si—C bonds in each of the first and second insulating interlayers.

In example embodiments, the copper-manganese capping pattern may have a thickness of about 0.1 nm to about 10 nm.

In example embodiments, a portion of the copper-manganese capping pattern on an upper central portion of the copper pattern may have a first thickness, and a portion of the copper-manganese capping layer pattern on an upper edge portion of the copper layer pattern may have a second thickness greater than the first thickness.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor device in accordance with example embodiments of the inventive concepts;

FIGS. 2 to 6 are cross-sectional views illustrating stages of a method of manufacturing a semiconductor device in accordance with example embodiments of the inventive concepts;

FIG. 7 is a cross-sectional view illustrating a semiconductor device in accordance with example embodiments of the inventive concepts;

FIG. 8 is a cross-sectional view illustrating a semiconductor device in accordance with example embodiments of the inventive concepts;

FIGS. 9 to 14 are cross-sectional views illustrating stages of a method of manufacturing the semiconductor device in accordance with example embodiments of the inventive concepts;

FIG. 15 is a cross-sectional view illustrating a semiconductor device in accordance with example embodiments of the inventive concepts;

FIG. 16 is a cross-sectional view illustrating a semiconductor device in accordance with example embodiments of the inventive concepts;

FIGS. 17 to 21 are cross-sectional views illustrating stages of a method of manufacturing the semiconductor device in accordance with example embodiments of the inventive concepts; and FIG. 22 is a block diagram illustrating a schematic construction of a system in accordance with example embodiments of the inventive concepts.

DESCRIPTION OF EMBODIMENTS

Figure 1:
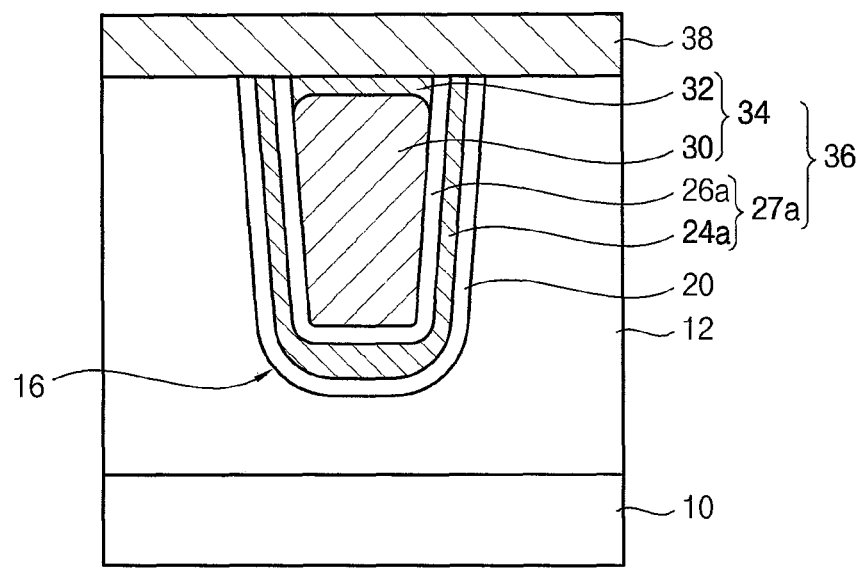
FIGS. 1 to 22 represent non-limiting, example embodiments as described herein.

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this description will be thorough and complete, and will fully convey the scope of the present inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view illustrating a semiconductor device in accordance with example embodiments of the inventive concepts.

Referring to FIG. 1, the semiconductor device may be formed on a substrate 10, and may include an insulating interlayer 12 having a recess 16 therein, a damage curing layer 20 on an inner surface of the recess 16, and a wiring structure 36 filling the recess 16 having the damage curing layer 20 therein. The semiconductor device may further include a capping insulating layer 38 covering upper surfaces of the insulating interlayer 12 and the wiring structure 36.

The substrate 10 may be a silicon substrate, a germanium substrate, a silicon-germanium substrate, a silicon-on-insulator (SOI) substrate, a germanium-on-insulator (GOI) substrate, etc.

The insulating interlayer 12 may include a low-k material whose a dielectric constant is lower than a dielectric constant of silicon nitride. The dielectric constant of the low-k material may be lower than about 3.9, e.g., lower than about 2.2. The low-k material may include a porous material, and the dielectric constant of the low-k material may be low due to pores therein. The low-k material may include, e.g., polymethyl siloxane (MSQ), hydrogensilsesquioxane (HSQ), etc. The insulating interlayer 12 including MSQ may have Si—O bonds mainly. However, some oxygen atoms of the Si—O bonds may be substituted by a methyl group ($CH_3$).

In some embodiments, the recess 16 may be formed in an upper portion of the insulating interlayer 12. Alternatively, the recess 16 may pass through the insulating interlayer 12 to expose a top surface of the substrate 10, and thus an "opening" may be formed through the insulating interlayer 12.

In some embodiments, the recess 16 may extend in a direction. Alternatively, a plurality of recesses 16 may be formed in the insulating interlayer 12, which may be spaced apart from each other.

The damage curing layer 20 may include a low-k material whose a dielectric constant is lower than a dielectric constant of silicon nitride, which may be lower than about 3.9. For example, the dielectric constant of the low-k material may be lower than about 2.2.

In example embodiments, the damage curing layer 20 may include, e.g., a SiCO-based material. A density of the Si—C bonds in the damage curing layer 20 may be higher than a density of the Si—C bonds in the insulating interlayer 12. A porosity of the damage curing layer 20 may be lower than a porosity of the insulating interlayer 12.

In example embodiments, the inner surface of the recess 16 may be treated by a k-recovery process and/or a pore sealing process to form the damage curing layer 20 on the inner surface of the recess 16. The damage curing layer 20 may be formed by substituting a Si—OH group of the inner surface of the recess 16 using a gas having a Si—R group, e.g., $(CH_3)_3SiNH_2$. The damage curing layer 20 may not almost have Si—OH group having a hydrophilic property.

The wiring structure 36 may include a barrier layer structure 27a and a copper structure 34.

The barrier layer structure 27a may be conformally formed on the damage curing layer 20. For example, the barrier layer structure 27a may include a metal, e.g., tantalum, titanium, molybdenum, ruthenium, cobalt, etc., and/or a metal nitride, e.g., tantalum nitride titanium nitride, etc. The barrier layer structure 27a may have a single layer or a multi-layered structure.

In example embodiments, the barrier layer structure 27a may include a first barrier pattern 24a and a second barrier pattern 26a sequentially stacked. The first barrier pattern 24a may prevent the diffusion of copper, and the second barrier pattern 26a may help a seed copper layer to adhere to the barrier layer structure 27a. For example, the first and second barrier patterns 24a and 26a may have a stacked structure of a tantalum layer and a titanium nitride layer, a titanium layer and a titanium nitride layer, a tantalum layer and a ruthenium layer, a tantalum nitride layer and a ruthenium layer, etc.

In example embodiments, a thickness of a portion of the barrier layer structure 27a on a sidewall of the recess 16 may be less than a thickness of a portion of the barrier layer structure 27a on a bottom of the recess 16. Alternatively, the thickness of the portion of the barrier layer structure 27a on the sidewall of the recess 16 may be substantially equal to the thickness of the portion of the barrier layer structure 27a on the bottom of the recess 16.

As the barrier layer structure 27a may be formed on the damage curing layer 20 having the highly dense Si—C bonds and the low porosity, a metal included in the barrier layer structure 27a may not diffuse into the insulating interlayer 12.

Thus, the barrier layer structure 27a may not be broken down. Additionally, the smearing of the first barrier pattern 24a at an interface with the damage curing layer 20 may decrease. That is, a density of metal or metal nitride of a portion of the first barrier pattern 24a at the interface with the damage curing layer 20 may not decrease, and may be substantially the same as a density of metal or metal nitride of other portions of the first barrier pattern 24a. Although the barrier layer structure 27a has a thickness less than about 10 nm, the diffusion of copper may be effectively prevented by the barrier layer structure 27a. In example embodiments, the barrier layer structure 27a may have a reduced thickness of about 0.5 nm to about 20 nm. As the barrier layer structure 27a may have the reduced thickness, a volume of the copper structure 34 on the barrier layer structure 27a may increase. Thus, a resistance of the wiring structure 36 may decrease.

The copper structure 34 may be formed on the barrier layer structure 27a, and may include a copper pattern 30 and a copper-manganese capping pattern 32 sequentially stacked. A top surface of the copper structure 34 may be substantially flat.

The copper pattern 30 may fill the recess 16. The copper pattern 30 may include copper as a main ingredient, and may further include a small amount of manganese.

The copper pattern 30 may include manganese of about 0.005 wt % to about 5 wt %. A concentration of the manganese in the copper pattern 30 may be substantially uniform.

The copper pattern 30 may be formed on the barrier layer structure 27a having a high density, and thus the diffusion of copper may decrease.

The copper-manganese capping pattern 32 may include copper and manganese. The copper-manganese capping pattern 32 may cover an upper surface of the copper pattern 30. The copper-manganese capping pattern 32 may include manganese having a weight percentage higher than a weight percentage of the manganese in the copper pattern 30.

In example embodiments, the copper-manganese capping pattern 32 may include manganese of about 0.1 wt % to about 80 wt %, preferably, of about 0.5 wt % to about 30 wt %. The copper-manganese capping pattern 32 may have a thickness equal to or less than about 10 nm. In example embodiments, the copper-manganese capping pattern 32 may have a thickness of about 0.1 nm to about 10 nm.

The copper-manganese capping pattern 32 may have a varying thickness according to a position thereof. A portion of the copper-manganese capping pattern 32 on an upper central portion of the copper pattern 30 may have a first thickness, and a portion of the copper-manganese capping pattern 32 on an upper edge portion of the copper pattern 30 may have a second thickness greater than the first thickness.

As the copper-manganese capping pattern 32 is formed on the copper pattern 30, the diffusion of copper may decrease, and a resistance and a contamination of the copper structure 34 may decrease.

The capping insulating layer 38 may prevent copper atoms in the copper structure 34 from diffusing upwardly. The capping insulating layer 38 may include, e.g., silicon nitride, silicon oxynitride, silicon oxycarbonitride, etc.

The wiring structure 36 may include the barrier layer structure 27a having highly dense metal so that the diffusion of copper may decrease. The copper pattern 30 may include a reduced amount of manganese therein, so that a resistance of the copper pattern 30 may decrease. Also, the diffusion of copper may decrease due to the copper-manganese capping pattern 32 on the copper pattern 30, and thus failures caused by the diffusion of copper may decrease.

FIGS. 2 to 6 are cross-sectional views illustrating stages of a method of manufacturing a semiconductor device in accordance with example embodiments of the inventive concepts.

Figure 2:
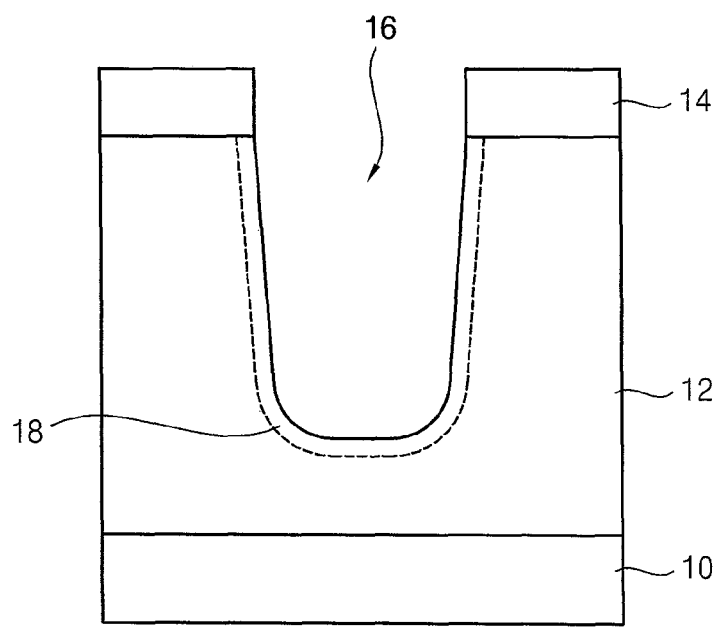

Referring to FIG. 2, an insulating interlayer 12 may be formed on a substrate 10, and a recess 16 may be formed in the insulating interlayer 12.

The insulating interlayer 12 may be formed of a low-k material whose a dielectric constant is lower than a dielectric constant of silicon nitride, i.e., about 3.9. For example, the dielectric constant of the low-k material may be lower than about 2.2. The low-k material may include a porous material, and the dielectric constant of the low-k material may be lowered by pores. The low-k material may include, e.g., MSQ, HSQ, etc. The insulating interlayer 12 including MSQ may mainly have Si—O bonds. However, some oxygen atoms of the Si—O bonds may be substituted by a methyl group ($CH_3$).

The insulating interlayer 12 may be formed by a spin coating process, a chemical vapor deposition (CVD) process or an atomic layer deposition (ALD) process.

The recess 16 may be formed by forming an etching mask 14 on the insulating interlayer 12, and anisotropically etching the insulating interlayer 12 using the etching mask 14. In an example embodiment, the insulating interlayer 12 may be etched by, e.g., a reactive ion etching (RIE) process, a magnetically enhanced reactive ion etching (MERIE) process, an inductively coupled plasma (ICP) etching process, etc.

In some embodiments, the recess 16 may be formed in the insulating interlayer 12. Alternatively, the recess 16 may pass through the insulating interlayer 12 to expose a top surface of the substrate 10, and thus an "opening" may be formed therethrough. In other example embodiments, the recess 16 may extend in a direction. A plurality of recesses 16 may be formed to be spaced apart from each other.

During the etching process, a damaged region 18 may be formed at a surface of the recess 16 by reactive ions or highly dense plasma. The insulating interlayer 12 may have porosity, so that the damaged region 18 induced by the reactive ions or the highly dense plasma may be more enlarged. The damaged region 18 may include a plurality of dangling bonds and Si—OH groups with hydrophilicity. The etching mask 14 may be removed after the etching process.

Figure 3:
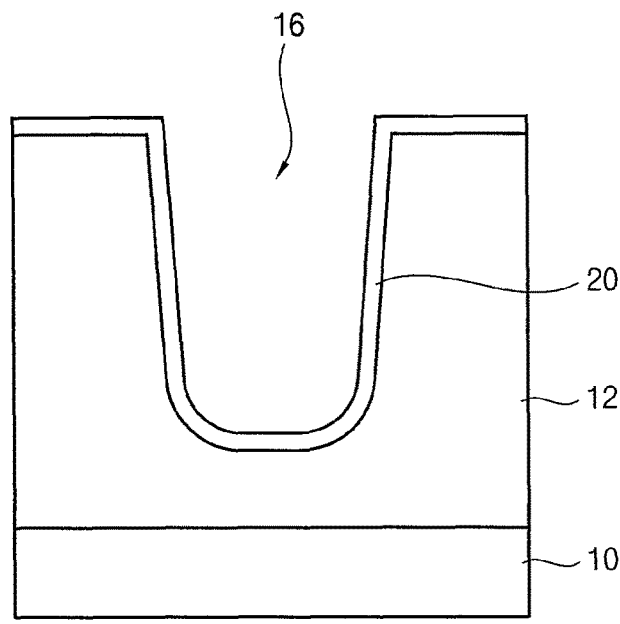

Referring to FIG. 3, a damage curing layer 20 may be formed on the surface of the recess 20. The damage curing layer 20 may be formed by substituting Si—C bonds or Si—O bonds for the Si—OH groups in the damaged region 18. As the damage curing layer 20 may be formed on the surface of the recess 16, the damaged region 18 may be removed. The damage curing layer 20 may be also formed on the insulating interlayer 12.

The damage curing layer 20 may include a SiCO-based material. A density of Si—C bonds in the damage curing layer 20 may be higher than a density of Si—C bonds in the insulating interlayer 12. A porosity of the damage curing layer 20 may be lower than a porosity of the insulating interlayer 12. The damage curing layer 20 may be formed by performing a k-recovery (or dielectric recovery) process and/or a pore sealing process.

By the k-recovery process, the damaged regions 18 may have a low dielectric constant. In example embodiments, a gas for substituting a Si—OH group in the damaged region 18 may be supplied to a chamber. The gas may include a Si—R group, e.g., $(CH_3)3SiNH_2$. Thus, the Si—OH group in the damaged region 18 may be substituted by Si—C bonds or Si—O bonds to form the damage curing layer 20 having a low dielectric constant and a high density.

By the pore sealing process, pores of the damaged region 18 may be filled. In the pore sealing process, a gas for substituting a Si—OH group in the damaged region 18 may be used. In example embodiments, the gas for substituting the Si—OH group in the damaged region 18 used in the pore sealing process may have a size of a Si—R group greater than a size of a Si—R group of the gas for substituting the Si—OH group in the damaged region 18 used in the k-recovery process, so that the pores of the damaged region 18 may be effectively filled by the gas.

In example embodiments, the damage curing layer 20 may be formed by performing the k-recovery process only. Alternatively, the damage curing layer 20 may be formed by performing the pore sealing process only. Alternatively, the damage curing layer 20 may be formed by sequentially performing the k-recovery process and the pore sealing process.

Figure 4:
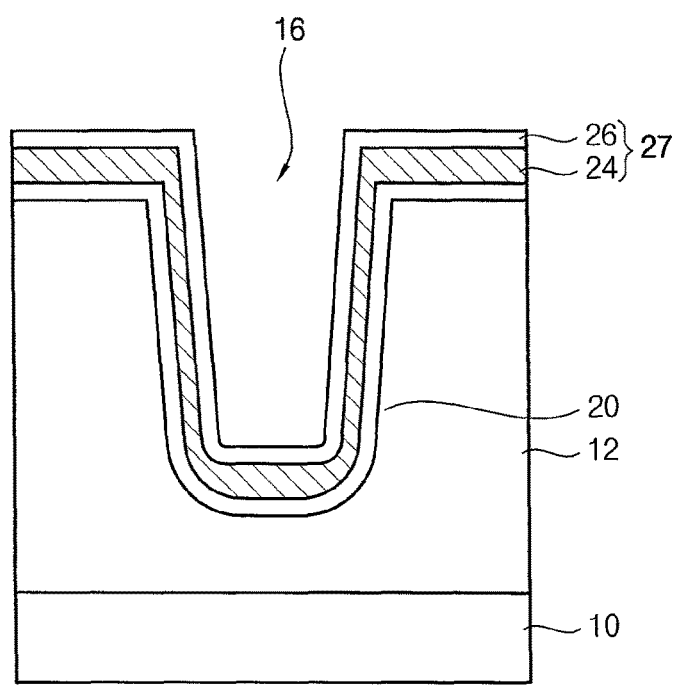

Referring to FIG. 4, a preliminary barrier layer structure 27 may be conformally formed on the damage curing layer 20.

For example, the preliminary barrier layer structure 27 may be formed of a metal, e.g., tantalum, titanium, molybdenum, ruthenium, cobalt, manganese, etc., and/or a metal nitride, e.g., tantalum nitride, titanium nitride, etc. The preliminary barrier layer structure 27 may be formed to have a single layer or a multi-layered structure.

In example embodiments, the preliminary barrier layer structure 27 may include a first barrier layer 24 and a second barrier layer 26 sequentially stacked. The first barrier layer 24 may prevent the diffusion of copper, and the second barrier layer 26 may help a seed copper layer to adhere to the preliminary barrier layer structure 27. For example, the first and second barrier layers 24 and 26 may have a stacked structure of a tantalum layer and a titanium nitride layer, a titanium layer and a titanium nitride layer, a tantalum layer and a ruthenium layer, a tantalum nitride layer and a ruthenium layer, etc.

The preliminary barrier layer structure 27 may be formed by a CVD process, an ALD process or a physical vapor deposition (PVD) process.

In example embodiments, a portion of the preliminary barrier layer structure 27 on a sidewall of the recess 16 may be formed to have a thickness less than a thickness of a portion of the barrier preliminary layer structure 27 on a bottom of the recess 16. Alternatively, the portion of the preliminary barrier layer structure 27 on the sidewall of the recess 16 may be formed to have a thickness substantially the same as a thickness of the portion of the preliminary barrier layer structure 27 on the bottom of the recess 16.

The preliminary barrier layer structure 27 may be formed on the damage curing layer 20 having the highly dense Si—C bonds and the low porosity, and thus metal in the preliminary barrier layer structure 27 may not diffuse into the insulating interlayer 12. Thus, the smearing of the first barrier pattern 24 at an interface with the damage curing layer 20 may decrease. That is, a density of a metal or a metal nitride in the first barrier pattern 24 at the interface with the damage curing layer 20 may not decrease. Although the preliminary barrier layer structure 27 may have a thickness less than about 10 nm, the diffusion of copper may be effectively prevented. In example embodiments, the preliminary barrier layer structure 27 may have a thickness of about 0.5 nm to about 20 nm.

Figure 5:
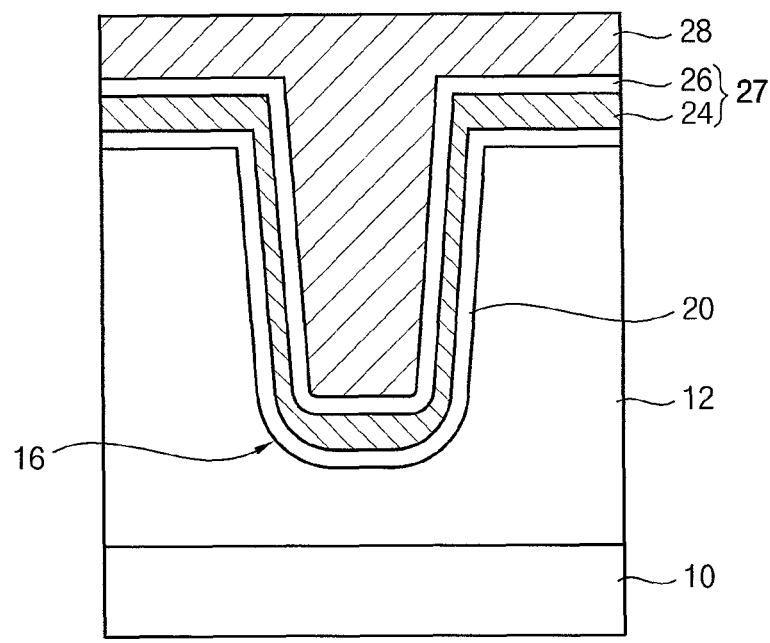

Referring to FIG. 5, a preliminary copper layer 28 may be formed on the seed copper layer to fill a remaining portion of the recess 16 by an electrolytic plating process. The seed copper layer may be formed on the preliminary barrier layer structure 27 prior to the formation of the preliminary copper layer 28.

The seed copper layer may be formed by a PVD process using copper as a target material.

In example embodiments, the electrolytic plating process may be performed using an additive and an electrolyte including copper ion and a small amount of manganese ion. A copper source material of the electrolyte may include an alkyl sulfonic acid copper, e.g., copper sulfate, copper methane sulfonate, etc. The additive may have a suppressor, an accelerator and a leveler. The suppressor may include a polymer, e.g., polyethylene glycol (PEG). The leveler may include a polymer, e.g., polyimine, polyamide, etc. The accelerator may include, e.g., an organic sulfur compound. The preliminary copper layer 28 formed by the electrolytic plating process may include copper and a small amount of manganese.

Figure 6:
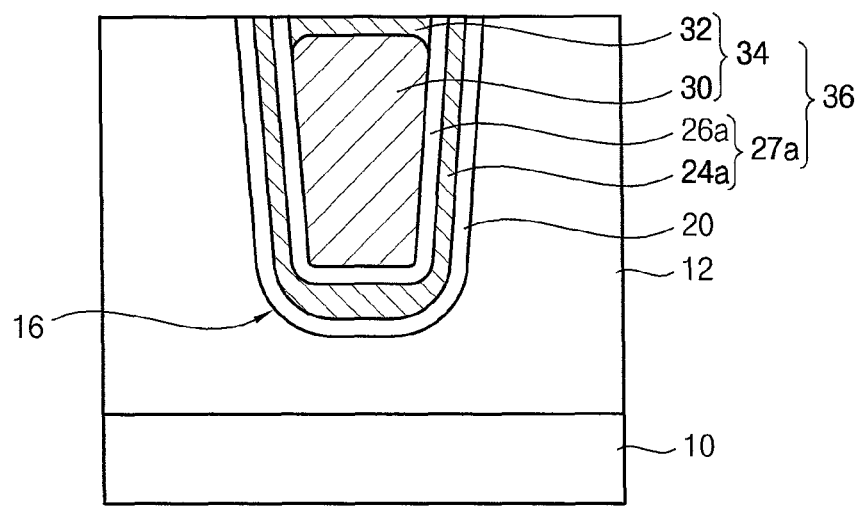

Referring to FIG. 6, an annealing process may be performed on the preliminary copper layer 28. The preliminary copper layer 28 and the preliminary barrier layer structure 27 may be planarized to form a copper structure 34 and a barrier layer structure 27a, respectively, in the recess 16.

The annealing process may be performed at a temperature of about 80° C. to about 450° C. Manganese atoms in the preliminary copper layer 28 may migrate toward an upper portion of the preliminary copper layer 28 through the annealing process. Thus, the preliminary copper layer 28 may be divided into a copper layer and a copper-manganese capping layer thereon.

In example embodiments, the planarization process may be performed by a chemical mechanical polishing (CMP) process. In example embodiments, the planarization process may be performed until a top surface of the insulating interlayer 12 is exposed.

Thus, the copper structure 34 including a copper pattern 30 and a copper-manganese capping pattern 32 may be formed in the recess 16. The copper-manganese capping pattern 32 may serve as a barrier layer for preventing the diffusion of copper atoms in the copper pattern 30.

In some embodiments, at least one annealing process may be further performed on the planarized preliminary copper layer 28 or the copper pattern 30 at a temperature of about 80° C. to about 450° C. The manganese atoms in the preliminary copper layer 28 or the copper pattern 30 may further migrate toward an upper portion of the preliminary copper layer 28 or an upper portion of the copper pattern 30 through the additional annealing process. Thus, a thickness of the copper-manganese capping pattern 32 and/or a concentration of manganese in the copper-manganese capping pattern 32 may increase.

The copper pattern 30 may be formed to include manganese of about 0.005 wt % to about 5 wt %. A concentration of the manganese in the copper pattern 30 may be substantially uniform. The copper-manganese capping pattern 32 may be formed to include manganese of about 0.1 wt % to about 80 wt % by the migration of the manganese atoms in the copper pattern 30. Preferably, the copper-manganese capping pattern 32 may include manganese of about 0.5 wt % to about 30 wt %. The copper-manganese capping pattern 32 may be formed to have a thickness equal to or less than about 10 nm. In example embodiments, the copper-manganese capping pattern 32 may have a thickness of about 0.1 nm to about 10 nm.

The manganese atoms may mainly migrate into an upper edge portion of the copper structure 34. Thus, a thickness of a portion of the copper-manganese capping pattern 32 on an edge portion of the copper pattern 30 may be greater than a thickness of a portion of the copper-manganese capping pattern 32 on other portions of the copper pattern 30.

By performing the above processes, a wiring structure 36 may be formed in the recess 16.

Referring to FIG. 1 again, a capping insulating layer 38 may be formed to cover the barrier layer structure 27a, the copper structure 34 and the insulating interlayer 12. The capping insulating layer 38 may be formed of, e.g., silicon nitride, silicon oxynitride, silicon oxycarbonitride, etc. In example embodiments, the capping insulating layer 38 may be formed by a CVD process As described above, the semiconductor device including the wiring structure 36 may be manufactured. In example embodiments, contact plugs and/or wiring patterns may be formed on the wiring structure 36. Contact plugs may be further formed between the substrate 10 and the wiring structure 36.

Figure 7:
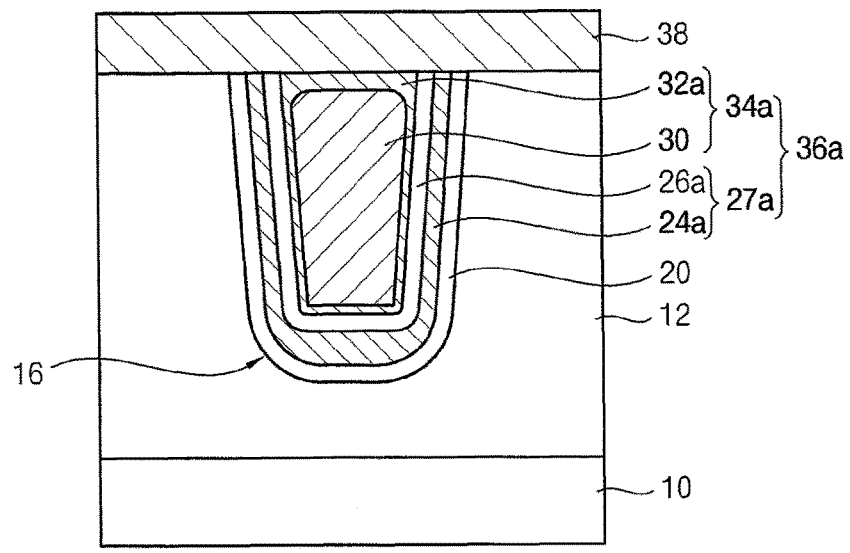

FIG. 7 is a cross-sectional view illustrating a semiconductor device in accordance with example embodiments of the inventive concepts.

The semiconductor device of FIG. 7 may be substantially the same as the semiconductor device of FIG. 1, except for the copper structure. Thus, like reference numerals refer to like elements, and detailed descriptions thereon are omitted herein.

Referring to FIG. 7, the semiconductor device may be formed on the substrate 10, and may include the insulating interlayer 12 having the recess 16 thereon, the damage curing layer 20 on the inner surface of the recess 16, and a wiring structure 36a filling the recess 16 having the damage curing layer 20 therein. The semiconductor device may include the capping insulating layer 38 covering upper surfaces of the insulating interlayer 12 and the wiring structure 36a.

The wiring structure 36a may include the barrier layer structure 27a and a copper structure 34a.

The barrier layer structure 27a may be substantially the same as or similar to that illustrated with reference to FIG. 1. The copper structure 34a may include the copper pattern 30 and the copper-manganese capping pattern 32a.

The copper pattern 30 may fill most of the recess 16, and may include copper as a main ingredient and a small amount of manganese. The copper pattern 30 may include manganese of about 0.005 wt % to about 5 wt %. A concentration of the manganese may be substantially uniform in the copper pattern 30.

The copper-manganese capping pattern 32a may include a first portion between the copper pattern 30 and the barrier layer structure 27a (or a first portion covering a sidewall and a bottom of the copper pattern 30) and a second portion covering an upper surface of the copper pattern 30. Thus, the copper-manganese capping pattern 32a may enclose a surface of the copper pattern 30. The copper-manganese capping pattern 32a may include manganese having a weight percentage higher than a weight percentage of manganese in the copper pattern 30.

The first portion may have a thickness less than a thickness of the second portion. An amount of manganese in the first portion may be less than an amount of manganese in the second portion. The second portion may have a thickness equal to or less than about 10 nm. In example embodiments, the second portion may have a thickness of about 0.1 nm to about 10 nm. An edge portion of the second portion may have a thickness greater than thicknesses of other portions of the second portion.

The copper-manganese capping pattern 32a may be formed on the copper pattern 30, so that the diffusion of copper may decrease. Thus, a resistance and a contamination of the copper structure 36 may decrease.

The semiconductor device of FIG. 7 may be manufactured by performing processes substantially the same as those illustrated with reference to FIGS. 2 to 6.

In the annealing process of the preliminary copper layer 28 or the copper pattern 30, some of manganese atoms may migrate toward the barrier layer structure 27a as well as the upper portion of the preliminary copper layer 28 or the copper pattern 30 by a control of an annealing condition, and thus the copper-manganese capping pattern 32a having a relatively thin thickness may be also formed on the barrier layer structure.

Figure 8:
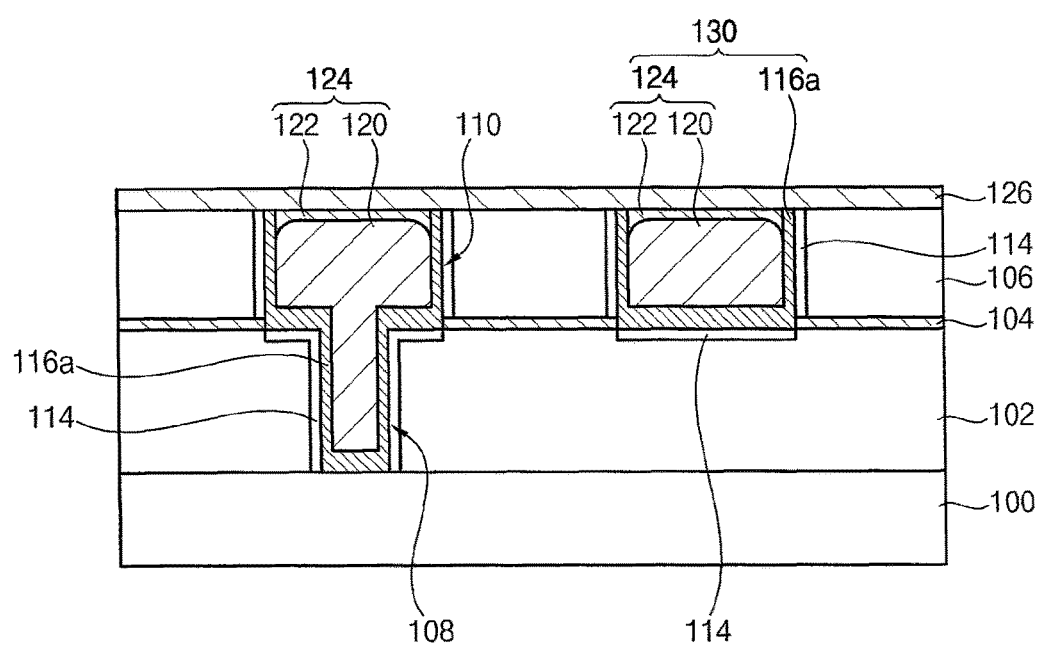

FIG. 8 is a cross-sectional view illustrating a semiconductor device in accordance with example embodiments.

Referring to FIG. 8, the semiconductor device may be formed on a substrate 100, and may include a first insulating interlayer 102 having a via hole 108 therethrough, a second insulating interlayer 106 having a trench 110 therethrough on the first insulating interlayer, a damage curing layer 114, and a wiring structure 130 in the via hole 108 and the trench 110. The semiconductor device may further include a first etch stop layer 104 and a second etch stop layer 126.

In example embodiments, the first insulating interlayer 102 may include a low-k material having porosity. Alternatively, the first insulating interlayer 102 may include silicon oxide layer having no or low porosity therein.

The first etch stop layer 104 may be formed on the first insulating interlayer 102. The first etch stop layer 104 may serve as a barrier layer for preventing the diffusion of copper. The first etch stop layer 104 may include, e.g., silicon nitride, silicon oxynitride, silicon oxycarbonitride, etc.

In example embodiments, the second insulating interlayer 106 may include a low-k material having porosity. The low-k material in each of the first and second insulating interlayers 102 and 106 may include, e.g., MSQ, HSQ, etc.

The first and second interlayer insulating layers 102 and 106 formed using MSQ may mainly have Si—O bonds, however, some oxygen atoms of the Si—C bonds may be substituted by a methyl group (CH$_3$).

The trench 110 may extend in the first direction. A lower portion of the trench 110 may include a first portion exposing a top surface of the first insulating interlayer 102, and a second portion being in communication with the via hole 108.

In example embodiments, the damage curing layer 114 may include, e.g., a SiOC-based material. A density of Si—C bonds in the damage curing layer 114 may be higher than a density of Si—C bonds in the second insulating interlayer 106. A porosity of the damage curing layer 114 may be lower than a porosity of each of the first and second insulating interlayers 102 and 106. The damage curing layer 114 may be formed by performing a k-recovery process and/or a pore sealing process on inner surfaces of the via hole 108 and the trench 110.

In example embodiments, a gas for substituting a Si—OH group may be supplied to inner surfaces of the via hole 108 and the trench 110. The Si—OH group in a damaged region on the inner surfaces of the via hole 108 and the trench 110 may be substituted by a Si—R group to form the damage curing layer 114. Thus, the damage curing layer 114 may not have almost Si—OH group having hydrophilicity.

When the first insulating interlayer 102 includes the low-k material having porosity, the damage curing layer 114 may be formed on the inner surfaces of the via hole 108 and the trench 110. Alternatively, when the first insulating interlayer 102 includes silicon oxide having no or low porosity, the damage curing layer 114 may not be formed on a sidewall of the via hole 108, but may be formed only on a sidewall of the trench 110.

The wiring structure 130 may include a barrier pattern 116a and a copper structure 124.

The barrier pattern 116a may be conformally formed on the damage curing layer 114. For example, the barrier pattern 116a may be formed of a metal, e.g., tantalum, titanium, molybdenum, ruthenium, cobalt, manganese, etc., and/or a metal nitride, e.g., tantalum nitride, titanium nitride, etc. The barrier pattern 116a may be formed to have a single layer or a multi-layered structure. For example, the barrier pattern 116a may have a stacked structure of a tantalum layer and a titanium nitride layer, a titanium layer and a titanium nitride layer, a tantalum layer and a ruthenium layer, a tantalum nitride layer and a ruthenium layer, etc.

In example embodiments, a portion of the barrier pattern 116a on sidewalls of the via hole 108 and the trench 110 may have a thickness less than a thickness of a portion of the barrier pattern 116a on bottoms of the via hole 108 and the trench 110. Alternatively, the portion of the barrier pattern 116a on the sidewalls of the via hole 108 and the trench 110 may have a thickness substantially the same as a thickness of the portion of the barrier pattern 116a on the bottoms of the via hole 108 and the trench 110.

The barrier pattern 116a may be formed on the damage curing layer 114 having a highly dense Si—C bonds and a low porosity, and thus metal in the barrier pattern 116a may not diffuse into the first and second insulating interlayers 102 and 106. Thus, the barrier pattern 116a may have desired characteristics. The barrier pattern 116a on the sidewall of the trench 110 may have a thickness of about 0.5 nm to about 20 nm. As the barrier pattern 116a may have the reduced thickness, a volume of the copper structure 124 may increase. Thus, a resistance of the wiring structure 130 may decrease.

The copper structure 124 may be formed on the barrier pattern 116a, and may include a copper pattern 120 and a copper-manganese capping pattern 122 sequentially stacked.

The copper pattern 120 may fill the via hole 108 and the trench 110. That is, the copper structure 124 may include a via contact including the copper pattern 120 filling the via hole 108, and a conductive line including the copper pattern 120 and the copper-manganese capping pattern 122 which fill the trench 110.

The copper pattern 120 may include copper as a main ingredient and a small amount of manganese. The copper pattern 120 may include manganese of about 0.005 wt % to about 5 wt %. A concentration of manganese may be substantially uniform in the copper pattern 120.

The copper-manganese capping pattern 122 may include copper and manganese. The copper-manganese capping pattern 122 may cover an upper surface of the copper pattern 120. The copper-manganese capping pattern 122 may include manganese having a weight percentage higher than a weight percentage of manganese in the copper pattern 120.

In example embodiments, the copper-manganese capping pattern 122 may include manganese of about 0.1 wt % to about 80 wt %, preferably, about 0.5 wt % to about 30 wt %. The copper-manganese capping pattern 122 may have a thickness equal to or less than about 10 nm. In example embodiments, the copper-manganese capping pattern 122 may have a thickness of about 0.1 nm to about 10 nm.

The copper-manganese capping pattern 122 may have a varying thickness according to a position thereof. A portion of the copper-manganese capping pattern 122 on an upper central portion of the copper pattern 120 may have a first thickness, and a portion of the copper-manganese capping pattern 122 on an upper edge portion of the copper pattern 120 may have a second thickness greater than the first thickness.

The copper-manganese capping pattern 122 may be formed on the copper pattern 120, so that the diffusion of copper may decrease. Thus, a resistance and a contamination of the copper structure 124 may decrease.

The second etch stop layer 126 may be used in a subsequent etching process for forming a wiring. The second etch stop layer 126 may prevent copper atoms in the copper structure 124 from diffusing upwardly. The second etch stop layer 126 may include, e.g., silicon nitride, silicon oxynitride, silicon oxycarbonitride, etc.

The wiring structure 130 may have a low resistance, and a failure induced by the diffusion of copper may decrease.

FIGS. 9 to 14 are cross-sectional views illustrating stages of a method of manufacturing a semiconductor device in accordance with example embodiments of the inventive concepts.

Figure 9:
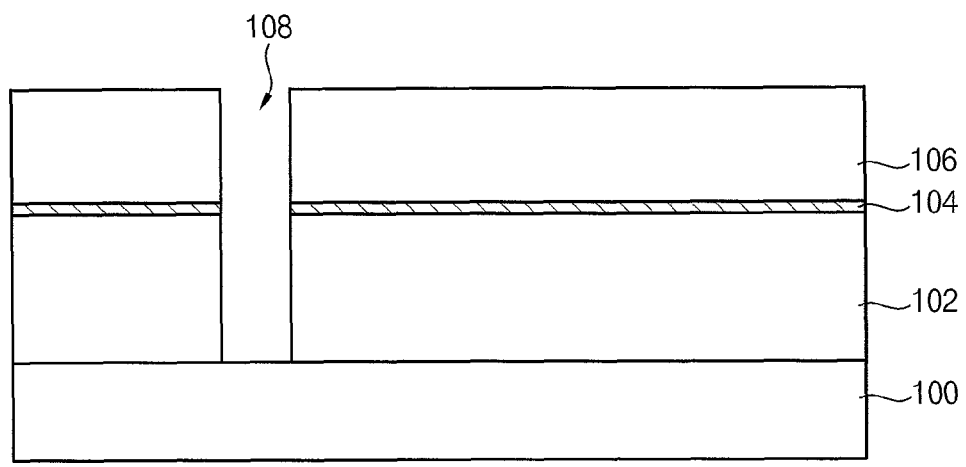

Referring to FIG. 9, a first insulating interlayer 102, a first etch stop layer 104 and a second insulating interlayer 106 may be sequentially formed on a substrate 100, and the first insulating interlayer 102, the first etch stop layer 104 and the second insulating interlayer 106 may be partially etched to form a via hole 108.

In example embodiments, the first insulating interlayer 102 may be formed of a low-k material having porosity. Alternatively, the first insulating interlayer 102 may be formed of silicon oxide having no or low porosity.

The first etch stop layer 104 may be formed of, e.g., silicon nitride, silicon oxynitride, silicon oxycarbonitride, etc.

In example embodiments, the second insulating interlayer 106 may be formed of a low-k material having porosity. The low-k material in each of the first and second insulating interlayers 102 and 106 may include, e.g., MSQ, HSQ, etc.

The first and second insulating interlayers 102 and 106 may be formed by a spin coating process, a CVD process or an ALD process. The first etch stop layer 104 may be formed by a CVD process or an ALD process.

The via hole 108 may be formed by forming a first etching mask on the second insulating interlayer 106, and anisotropically etching the second insulating interlayer 106, the first etch stop layer 104 and the first insulating interlayer 102 using the first etching mask.

Figure 10:
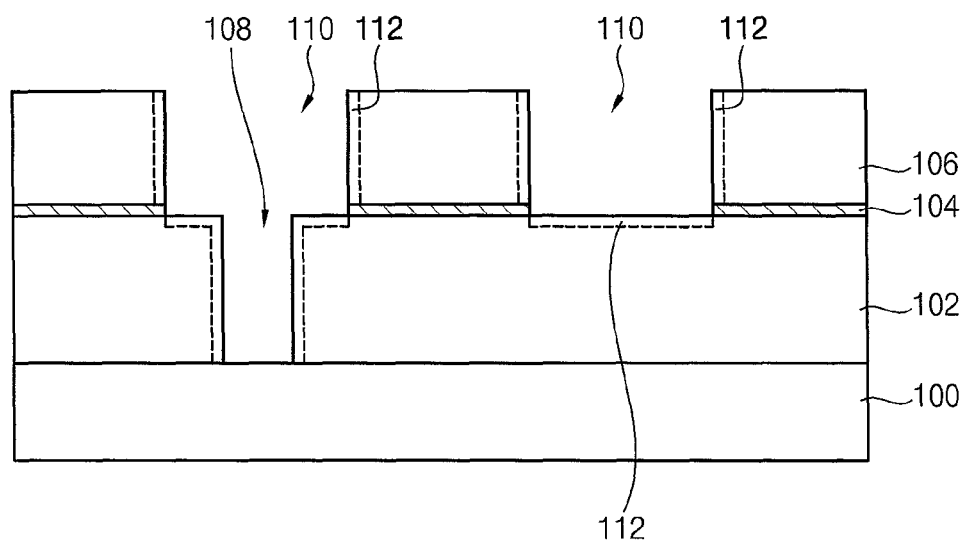

Referring to FIG. 10, a second etching mask may be formed on the second insulating interlayer 106. The second insulating interlayer 106 and the first etch stop layer 104 may be etched using the second etching mask to form a trench 110.

The trench 110 may be formed to extend in the first direction. A lower portion of the trench 110 may include a first portion exposing a top surface of the first insulating interlayer 102, and a second portion in communication with the via hole 108.

During the etching process, a damaged region 112 induced by reactive ions or highly dense plasma may be formed at surfaces of the first and second insulating interlayer 102 and 106 exposed by the trench 110 and the via hole 108. That is, the damaged region 112 may be formed at inner surfaces of the trench 110 and the via hole 108.

Figure 11:
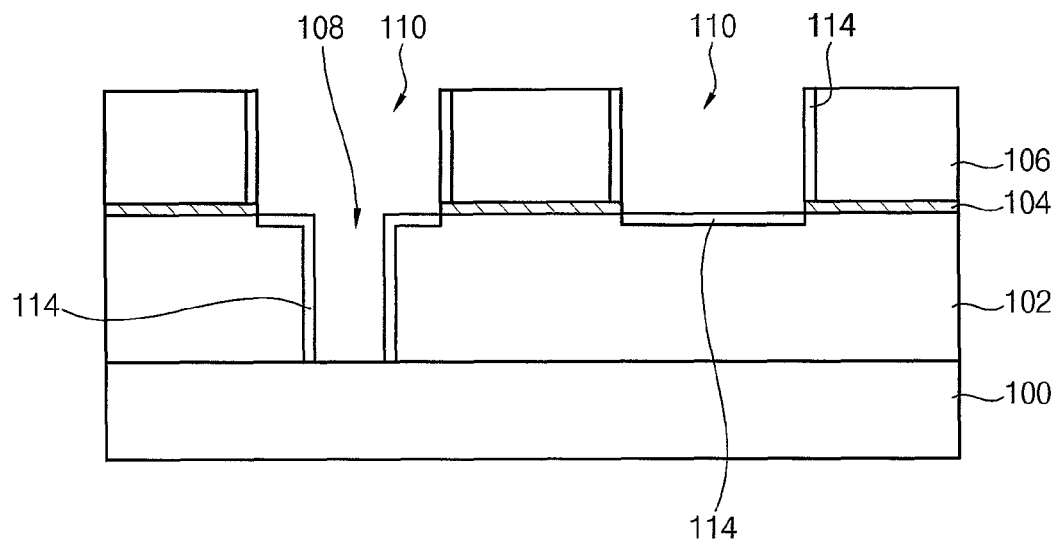

Referring to FIG. 11, a damage curing layer 114 may be formed on the inner surfaces of the trench 110 and the via hole 108. The damage curing layer 114 may be formed by substituting Si—C bonds or Si—O bonds for the Si—OH groups in the damaged region 112. As the damage curing layer 114 may be formed on the inner surfaces of the trench 110 and the via hole 108, the damaged region 112 may be removed.

In some embodiments, the damage curing layer 114 may be also formed on the second insulating interlayer 106 and a bottom of the via hole 108. In this case, the damage curing layer 114 on the bottom of the via hole 108 may be selectively removed.

In example embodiments, the damage curing layer 114 may include a SiCO-based material. A density of Si—C bonds in the damage curing layer 114 may be higher than a density of Si—C bonds in each of the first and second insulating interlayers 102 and 106. A porosity of the damage curing layer 114 may be lower than a porosity of each of the first and second insulating interlayers 102 and 106. The damage curing layer 114 may be formed by performing a k-recovery process and/or a pore sealing process. The k-recovery process and the pore sealing process may be substantially the same as those illustrated with reference to FIG. 3.

Figure 12:
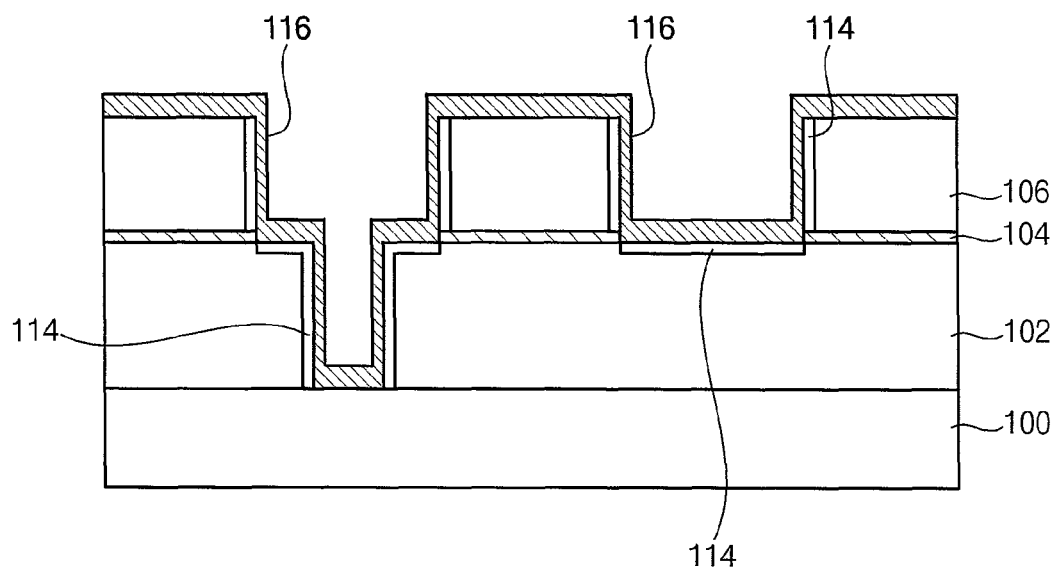

Referring to FIG. 12, a barrier layer 116 may be conformally formed on the inner surfaces of the trench 110 and the via hole 108 and a top surface of the second insulating interlayer 106 to cover the damage curing layer 114.

In example embodiments, the barrier layer 116 may be formed of a metal, e.g., tantalum, titanium, molybdenum, ruthenium, cobalt, manganese, etc., and/or a metal nitride, e.g., tantalum nitride, titanium nitride, etc. The barrier layer 116 may be formed to have a single layer or a multi-layered structure. For example, the barrier layer 116 may have a stacked structure of a tantalum layer and a titanium nitride layer, a titanium layer and a titanium nitride layer, a tantalum layer and a ruthenium layer, a tantalum nitride layer and a ruthenium layer, etc.

The process for forming the barrier layer 116 may be substantially the same as that illustrated with reference to FIG. 4.

Figure 13:
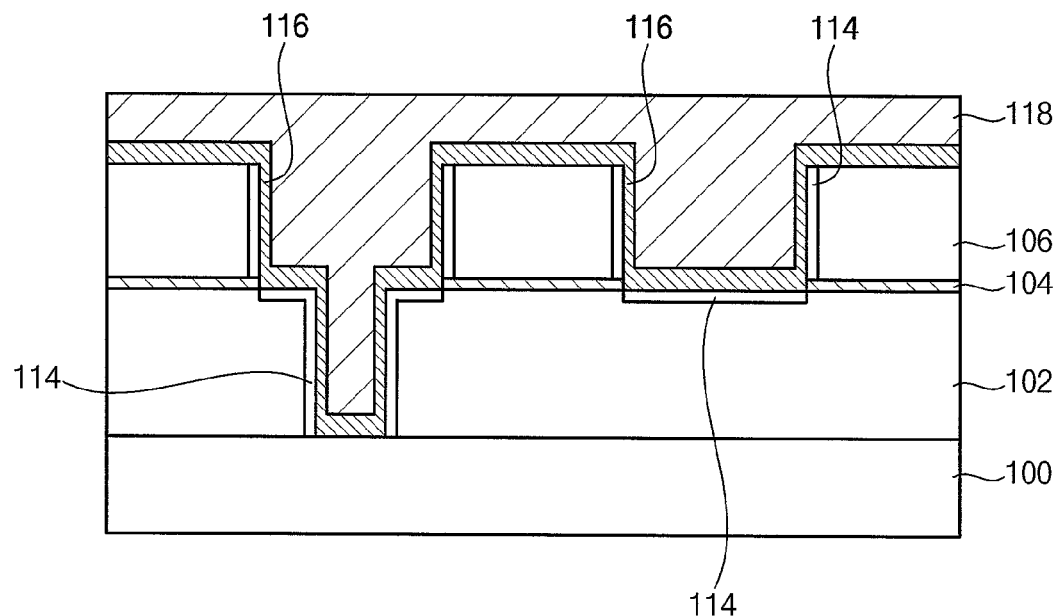

Referring to FIG. 13, a seed copper layer may be formed on the barrier layer 116. A preliminary copper layer 118 may be formed on the seed copper layer to fill remaining portions of the via hole 108 and the trench 110 by an electrolytic plating process.

The process for forming the preliminary copper layer 117 may be substantially the same as that illustrated with reference to FIG. 5.

Figure 14:
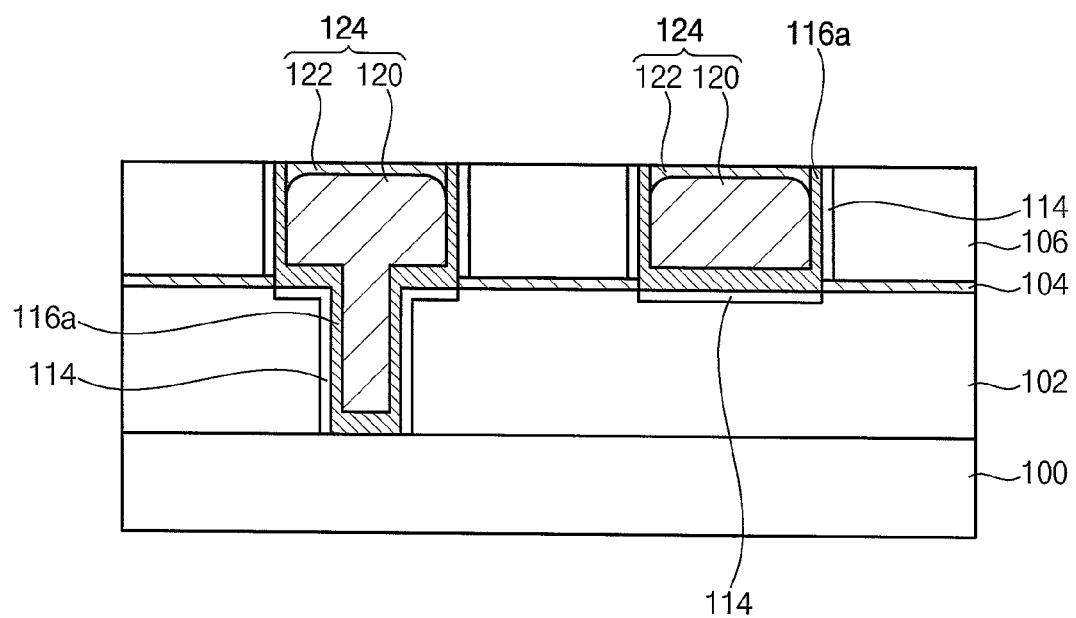

Referring to FIG. 14, an annealing process may be performed on the preliminary copper layer 118. The preliminary copper layer 118 and the barrier layer 116 may be planarized to form a copper structure 124 and a barrier pattern 116a, respectively, in the via hole 108 and the trench 110. In some embodiments, at least one annealing process may be further performed on the planarized preliminary copper layer 118 or the copper structure 124.

Referring to FIG. 8 again, a second etch stop layer 126 may be formed to cover the copper structure 124, the barrier pattern 116a and the second insulating interlayer 106. The second etch stop layer 126 may be formed of, e.g., silicon nitride, silicon oxynitride, silicon oxycarbonitride, etc.

As described above, the semiconductor device including a wiring structure may be manufactured.

Figure 15:
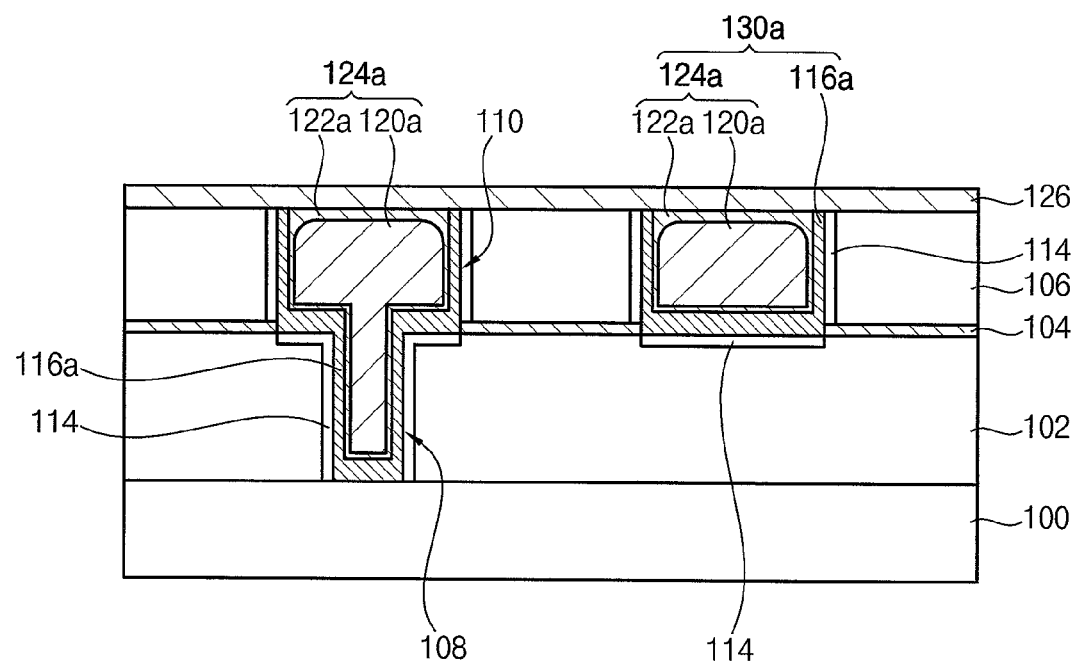

FIG. 15 is a cross-sectional view illustrating a semiconductor device in accordance with example embodiments of the inventive concepts.

The semiconductor device may be substantially the same as or similar to the semiconductor device of FIG. 8, except for the copper structure. Thus, like reference numerals refer to like elements, and detailed descriptions thereon are omitted herein.

Referring to FIG. 15, the semiconductor device may be formed on the substrate 100, and may include the first insulating interlayer 102 having the via hole 108 therethrough, the second insulating interlayer 106 having the trench 110 therethrough on the first insulating interlayer 102, the damage curing layer 114, and a wiring structure 130a in the via hole 108 and the trench 110. The semiconductor device may further include the first etch stop layer 104 and the second etch stop layer 126.

The wiring structure 130a may include the barrier pattern 116a and a copper structure 124a. The copper structure 124a filling the via hole 108 and the trench 110 may include a copper pattern 120a and a copper-manganese capping pattern 122a.

The copper pattern 120a may fill the via hole 108 and a lower portion of the trench 110.

The copper-manganese capping pattern 122a may include a first portion the copper pattern 120a and the barrier pattern 116a (or a first portion covering a sidewall and a bottom of the copper pattern 120a), and a second portion covering an upper surface of the copper pattern 120a. Thus, the copper-manganese capping pattern 122a may enclose a surface of the copper pattern 120a. The copper-manganese capping pattern 122a may include manganese having a weight percentage higher than a weight percentage of manganese in the copper pattern 120a.

The first portion may have a thickness less than a thickness of the second portion. An amount of manganese in the first portion may be less than an amount of manganese in the second portion. The second portion may have a thickness equal to or less than about 10 nm. In example embodiments, the second portion may have a thickness of about 0.1 nm to about 10 nm. An edge portion of the second portion may have a thickness greater than thicknesses of other portions of the second portion.

The barrier pattern 116a and the copper-manganese capping pattern 122a may be formed on the copper pattern 120a, so that the diffusion of copper may decrease. Thus, a resistance and a contamination of the copper structure 130a may decrease.

The semiconductor device of FIG. 15 may be manufactured by performing processes substantially the same as or similar to those illustrated with reference to FIGS. 9 to 14.

In the annealing process of the preliminary copper layer or the copper pattern, some of manganese atoms may migrate toward the barrier pattern 116a as well as an upper portion of the preliminary copper layer or the copper pattern by a control of an annealing condition, and thus the copper-manganese capping pattern 122a having a relatively thin thickness may be also formed on the barrier pattern 116a.

Figure 16:
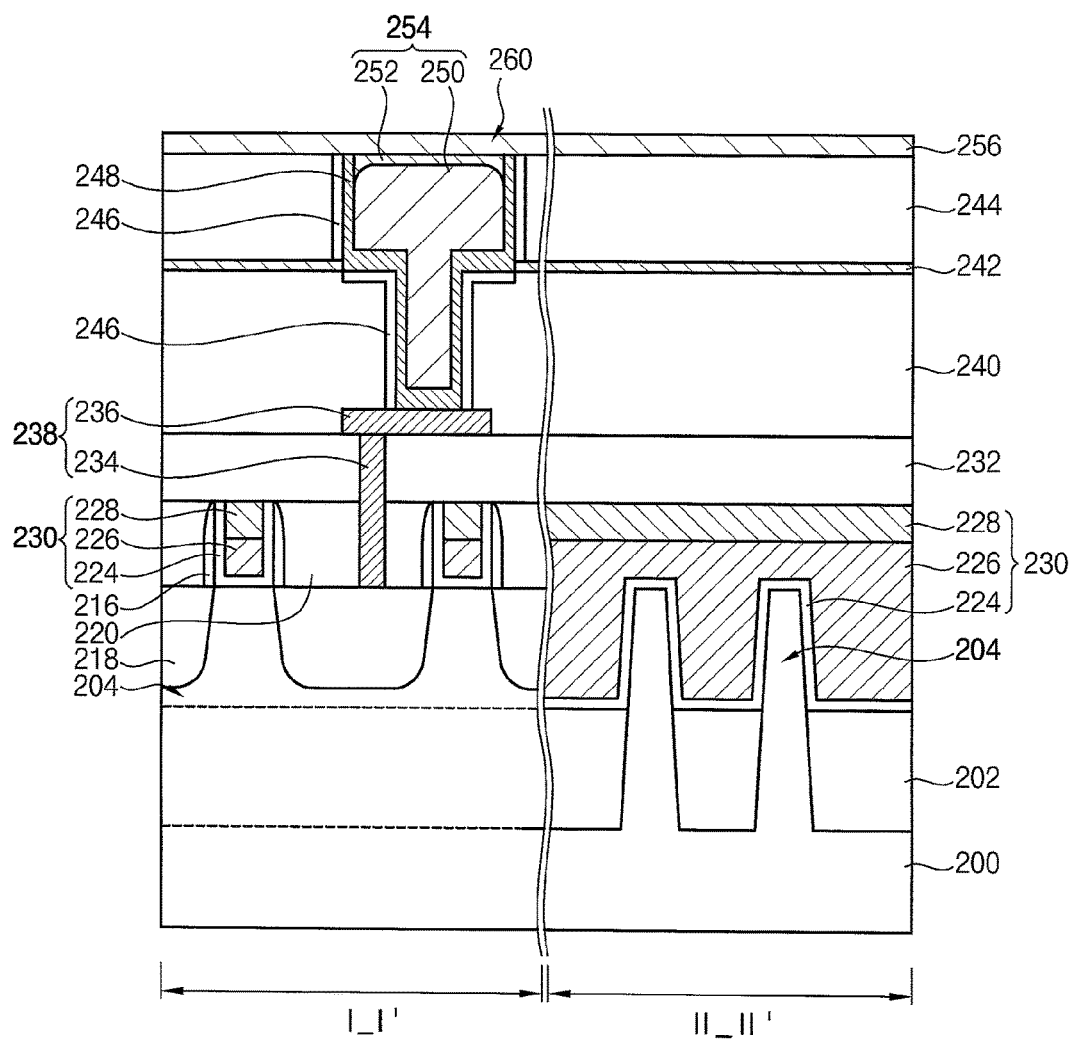

FIG. 16 is a cross-sectional view illustrating a semiconductor device in accordance with example embodiments of the inventive concepts.

FIG. 16 illustrates a semiconductor device including a finFET, however, the inventive concepts may not be limited thereto.

Referring to FIG. 16, the semiconductor device may be formed on a substrate 200, and may include a finFET, a lower wiring structure 238 electrically connected to the finFET, and an upper wiring structure 260 electrically connected to the lower wiring structure 238.

The finFET may include a gate structure 230 and impurity regions 218.

A field region of which a top surface may be covered by an isolation layer 202 and an active region of which a top surface may not be covered by the isolation layer 202 may be defined in the substrate 200. The active region may protrude above the isolation layer 202 and have a fin-like shape, and thus may be referred to as an active fin 204.

In example embodiments, the active fin 204 may extend in a first direction substantially parallel to a top surface of the substrate 200, and a plurality of active fins 204 may be formed to be arranged in a second direction crossing the first direction and substantially parallel to the top surface of the substrate 200. In example embodiments, the second direction may be substantially perpendicular to the first direction.

The isolation layer 202 may include an oxide, e.g., silicon oxide.

In example embodiments, the gate structure 230 may extend in the second direction to cover the active fin 204, and a plurality of gate structures 230 may be formed to be arranged in the first direction.

In example embodiments, each of the gate structures 230 may include a gate insulation pattern 224, a gate electrode 226 and a hard mask 228 sequentially stacked on the active fin 204 and the isolation layer 202. The gate insulation pattern 224 may include a metal oxide having a high dielectric constant, e.g., hafnium oxide, tantalum oxide, zirconium oxide, etc., and the gate electrode 226 may include a material having a low resistance, e.g., a metal such as aluminum, copper, tantalum, etc., or a metal nitride thereof. A pad oxide layer may be further formed between the gate insulation pattern 224 and the substrate 200.

A gate spacer 216 may be formed on a sidewall of the gate structure 230, and may include a nitride, e.g., silicon nitride.

The impurity regions 218 may be formed at upper portions of the active fin 204 between the gate structures 230, and may serve as source/drain regions.

In some embodiments, a recess may be formed at an upper portion of the active fin 204 between the gate structures 230, and an epitaxial pattern may be formed in the recess. The epitaxial pattern may serve as the impurity regions 218.

A first insulating interlayer 220 may surround sidewalls of the gate structures 230. A second insulating interlayer 232 may be formed on the first insulating interlayer 220, and may cover the gate structures 230.

A first contact plug 234 may pass through the first and second insulating interlayers 220 and 232, and may be electrically connected to the impurity regions 218. A first conductive pattern 236 may be formed on the second insulating interlayer 232, and may contact the first contact plug 234. The first conductive pattern 236 may include a pad pattern or a conductive line.

The first and second insulating interlayers 220 and 232 may include silicon oxide having no or low porosity. The first contact plug 234 and the first conductive pattern 236 may include, e.g., doped polysilicon, a metal, a metal silicide, etc.

The lower wiring structure 238 may include the first contact plug 234 and the first conductive pattern 236, and may be formed by a front end of line (FEOL) process.

A wiring structure substantially the same as a structure illustrated in FIG. 8 may be formed on the first and second insulating interlayers 220 and 232.

That is, the wiring structure may include a third insulating interlayer 240 having a via hole therethrough, a fourth insulating interlayer 244 having a trench therethrough on the third insulating interlayer 240, a damage curing layer 246 and an upper wiring structure 260 in the via hole and the trench. The wiring structure may further include a first etch stop layer 242 and a second etch stop layer 256. The first etch stop layer 242 may be formed between the third and fourth insulating interlayers 240 and 244, and the second etch stop layer 256 may be formed on the fourth insulating interlayer 244 to cover the upper wiring structure 260.

The upper wiring structure 260 may include the barrier pattern 248 having highly dense metal or metal nitride, and a copper structure 254 including a copper pattern 250 and a copper-manganese pattern 252. As a result device failures caused by the diffusion of copper can be decreased.

FIGS. 17 to 21 are cross-sectional views illustrating stages of a method of manufacturing the semiconductor device shown in FIG. 16 in accordance with example embodiments of the inventive concepts.

Figure 17:
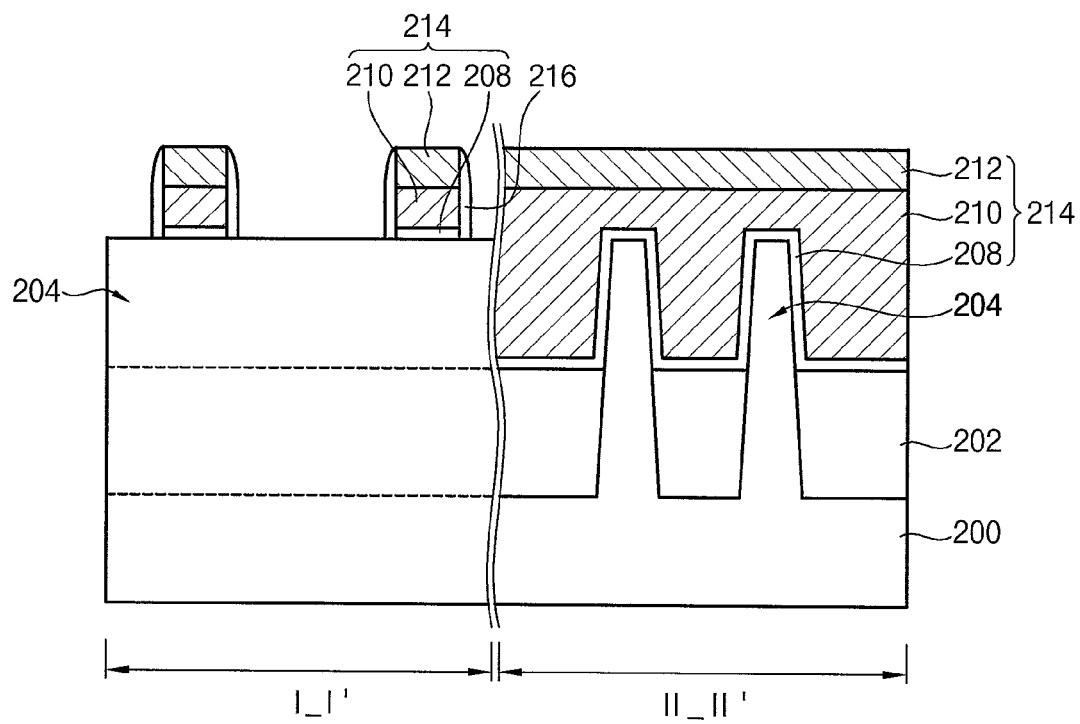

Referring to FIG. 17, an upper portion of a substrate 200 may be partially removed to form a trench, and an isolation layer 202 may be formed to fill a lower portion of the trench.

In example embodiments, the isolation layer 202 may be formed by forming an insulation layer on the substrate 200 to sufficiently fill the trench, planarizing the insulation layer until a top surface of the substrate 200 may be exposed, and removing an upper portion of the insulation layer to expose an upper portion of the trench. The insulation layer may be formed of an oxide, e.g., silicon oxide.

As the isolation layer 202 is formed, an active region of which a top surface may not be covered by the isolation layer 202 may be defined in the substrate 200. The active region may be referred to as an active fin 204. In example embodiments, the active fin 204 may extend in a first direction substantially parallel to the top surface of the substrate 200.

A plurality of dummy gate structures 214 may be formed on the substrate 200.

Particularly, the dummy gate structures 214 may be formed by sequentially stacking a dummy gate insulation layer, a dummy gate electrode layer and a gate mask layer on the active fins 204 and the isolation layer 202, patterning the gate mask layer by a photolithography process using a photoresist pattern as an etching mask to form a gate mask 212, and sequentially etching the dummy gate electrode layer and the dummy gate insulation layer using the gate mask 212 as an etching mask. Thus, each of the dummy gate structures 214 may be formed to include a dummy gate insulation pattern 208, a dummy gate electrode 210 and the gate mask 212 sequentially stacked.

A gate spacer 216 may be formed on sidewalls of the dummy gate structure 214.

In some embodiments, an upper portion of the active fin 204 between dummy gate structures 214 may be partially etched to form a recess, and an epitaxial pattern may be formed in the recess by a selective epitaxial growth (SEG) process.

Figure 18:
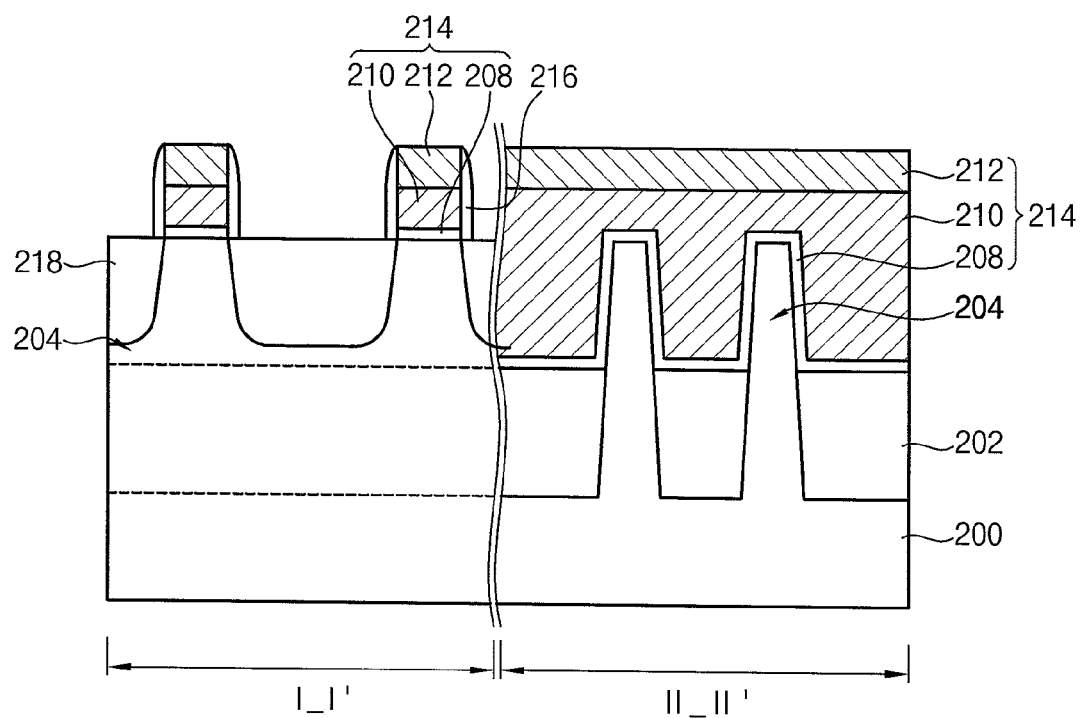

Referring to FIG. 18, impurity regions 218 may be formed at upper portions of the active fin 204 between the dummy gate structures 214, which may serve as source/drain regions.

In example embodiments, the impurities may be implanted into the active fin 204 to form the impurity regions 218. Alternatively, when the SEG process is performed to form an epitaxial pattern, an impurity source gas may be further provided to form the impurity regions 218 in the epitaxial pattern.

Figure 19:
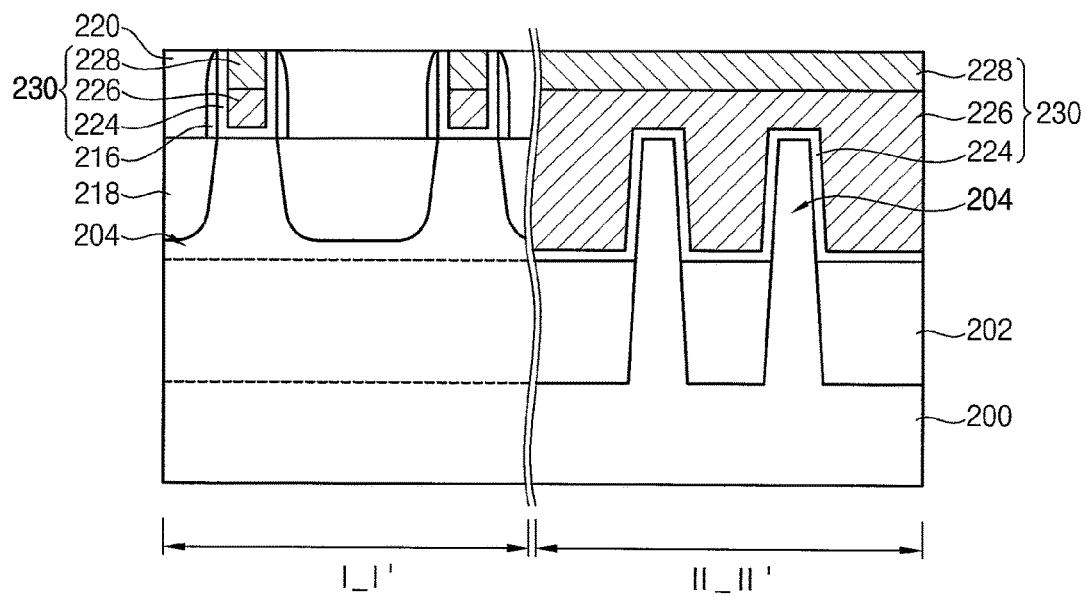

Referring to FIG. 19, a first insulating interlayer 220 covering the dummy gate structures 214, the gate spacers 216, the active fin 204 and the isolation layer 202 may be formed on the substrate 200, and an upper portion of the first insulating interlayer 220 may be planarized until top surfaces of the dummy gate structures 214 may be exposed. In example embodiments, the planarization process may be performed by a chemical mechanical polishing (CMP) process and/or an etch back process. The first insulating interlayer 220 may be formed of silicon oxide having no or low porosity.

The exposed dummy gate structures 214 may be removed to form openings, each of which exposes a top surface of the active fin 204. A gate structure 230 may be formed to fill each of the openings. The gate structure 230 may include a gate insulation pattern 224, a gate electrode 226 and a hard mask 228 sequentially stacked.

Particularly, a gate insulation layer may be formed of a material having a high dielectric constant on the exposed top surface of the active fin 204, sidewalls of the openings, and a top surface of the first insulating interlayer 220. A gate electrode layer may be formed on the gate insulation layer to fill remaining portions of the openings. The gate insulation layer may be formed of a metal oxide, e.g., hafnium oxide, tantalum oxide, zirconium oxide, etc. The gate electrode layer may be formed of a material having a low resistance, e.g., a metal such as aluminum, copper, tantalum, etc., or a metal nitride thereof.

The gate electrode layer and the gate insulation layer may be planarized until the top surface of the first insulating interlayer 220 may be exposed, and the gate electrode layer filling each of the openings may be partially etched. Thus, the gate insulation pattern 224 and the gate electrode 226 may be formed in each of the openings. A hard mask layer may be formed on the gate electrode 226 and the gate insulation pattern 224 to fill a remaining portion of each of the openings, and the hard mask layer may be planarized until the top surface of the first insulating interlayer 220 may be exposed to form the hard mask 228. In example embodiments, the planarization process may be performed by a CMP process and/or an etch back process.

Thus, the gate insulation pattern 224, the gate electrode 226 and the hard mask 228 sequentially stacked may form the gate structure 230. The gate structure 230 may be formed on the active fin 204 and the isolation layer 202, and may extend in a second direction which is substantially parallel to the top surface of the substrate 200 and substantially perpendicular to the first direction. The gate structure 230 and the impurity regions 218 may form a finFET.

Figure 20:
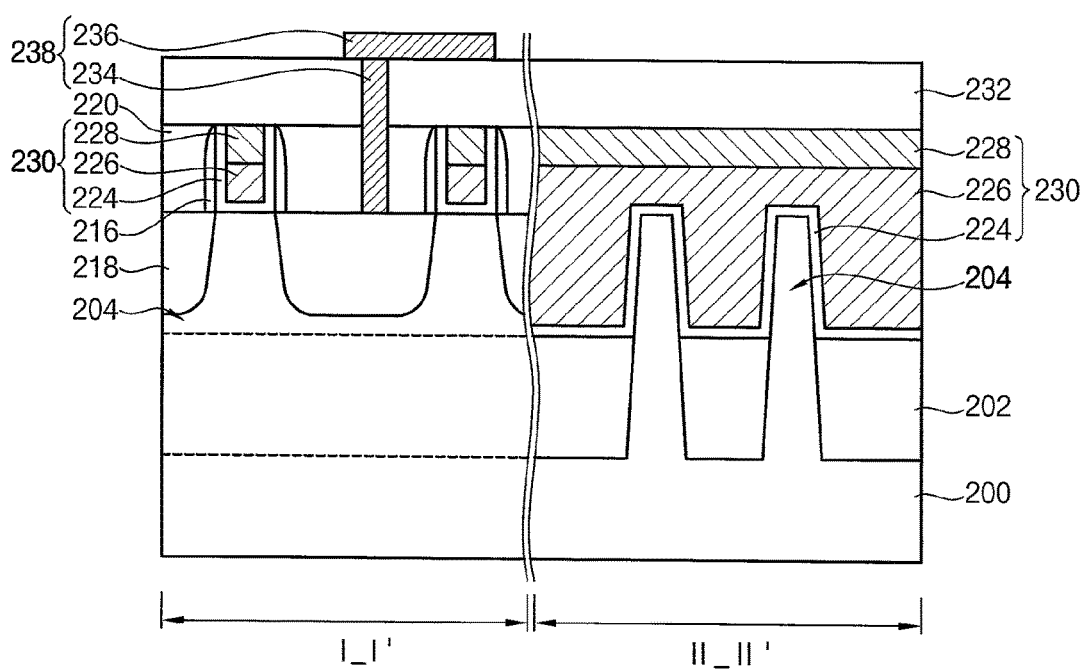

Referring to FIG. 20, a second insulating interlayer 232 may be formed on the first insulating interlayer 220 to cover the gate structures 230. A first contact plug 234 through the first and second insulating interlayers 220 and 232 may be formed to contact a top surface of at least one of the impurity regions 218. A first conductive pattern 236 may be formed on the second insulating interlayer 232 to contact the first contact plug 234. The second insulating interlayer 232 may be formed of silicon oxide having no or low porosity. The first contact plug 234 and the first conductive pattern 236 may be formed of, e.g., doped polysilicon, a metal, a metal silicide, etc.

Thus, the first contact plug 234 and the first conductive pattern 236 sequentially stacked may form a lower wiring structure 238.

Figure 21:
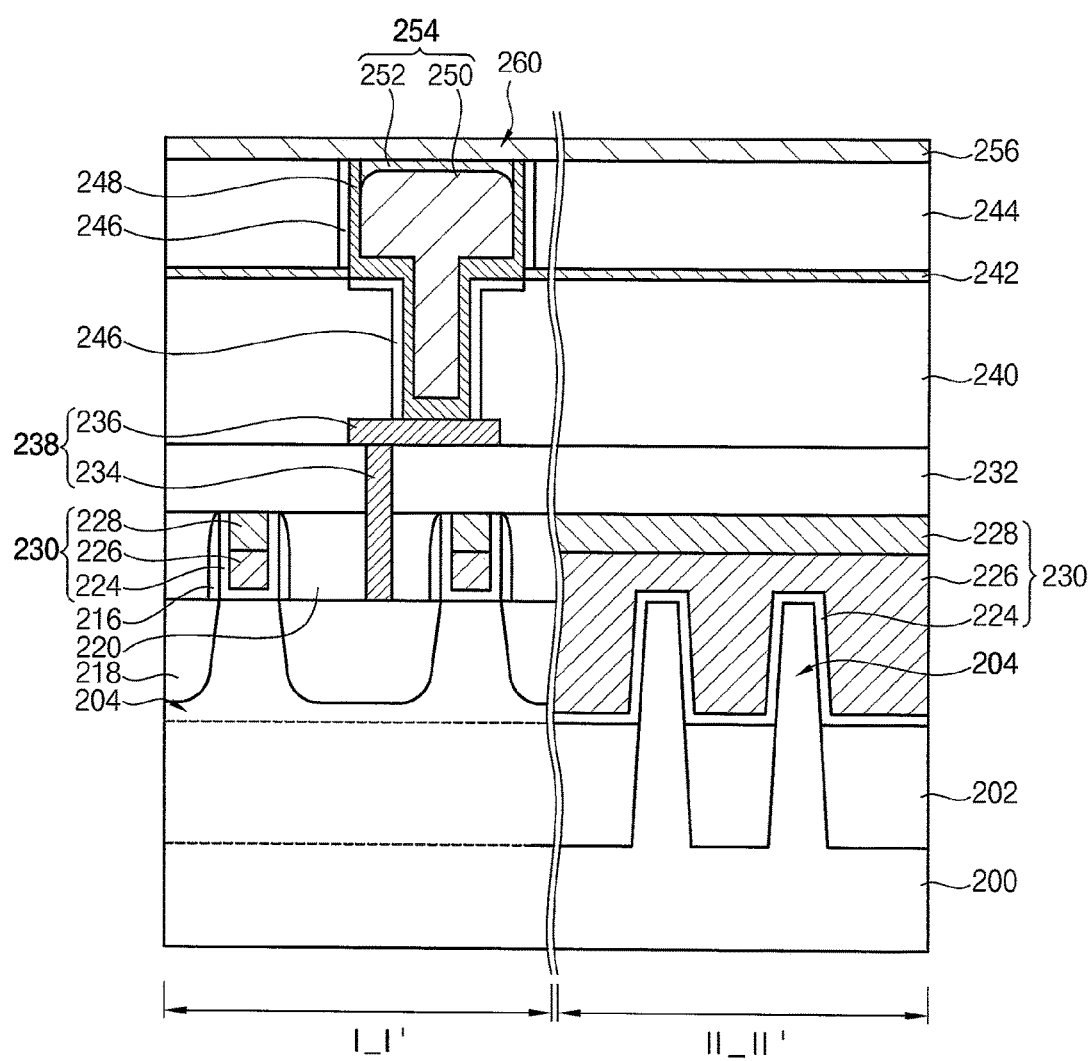

Referring to FIG. 21, processes substantially the same as or similar to those illustrated with reference to FIGS. 1 to 15 may be performed to manufacture the semiconductor device.

That is, a third insulating interlayer 240, a first etch stop layer 242 and a fourth insulating interlayer 244 may be sequentially formed on the second insulating interlayer 232. A via hole may be formed through the third insulating interlayer 240, and a trench in communication with the via hole may be formed through the first etch stop layer 242 and the fourth insulating interlayer 244. A damage curing layer 246 may be formed on inner surfaces of the via hole and the trench, and an upper wiring structure 260 may be formed on the damage curing layer 246.

The upper wiring structure 260 may include a barrier pattern 248 and a copper structure 254 including a copper pattern 250 and a copper-manganese capping pattern 252.

A second etch stop layer 256 may be formed on the fourth insulating interlayer 244 to cover the upper wiring structure 260.

In an embodiment of the present inventive concepts, a three dimensional (3D) memory array including a wiring structure is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587 and 8,559,235. In example embodiments, the 3D memory array may include the wiring structure in accordance with example embodiments.

The above semiconductor device may be applied to various types of systems, e.g., computing system.

Figure 22:
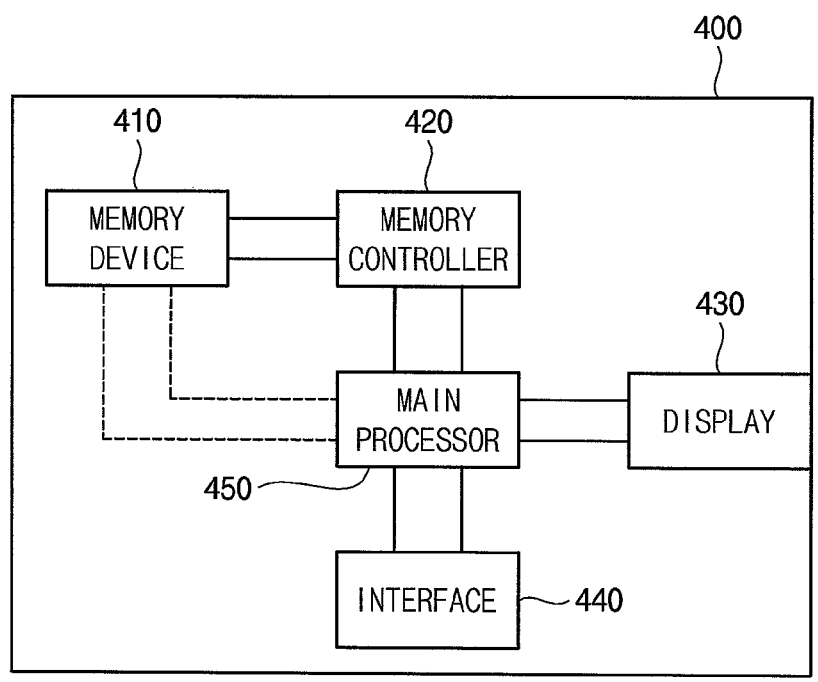

FIG. 22 is a block diagram illustrating a system in accordance with example embodiments of the inventive concepts.

Referring to FIG. 22, a system 400 may include a memory device 410, a memory controller 420 for controlling operations of the memory device 410, a displayer 430 for outputting data, an interface 440 for receiving data, and a main processor 450 for controlling elements in the system 400.

The memory device 410 may include a semiconductor device formed on the active structure in accordance with example embodiments. The memory device 410 may be directly connected to the main processor 450. Alternatively, the memory device 410 may be electrically connected to the main processor 450 via a bus. The system 400 may be applied to a computer, a portable computer, a laptop computer, a personal digital assistant, a tablet personal computer, a mobile phone, a digital music player, etc.

According to example embodiments of the inventive concepts, the wiring structure of the semiconductor device may be formed in the insulating interlayer having the low-k material. Also, as the barrier pattern included in the wiring structure may be formed on the damage curing layer, a diffusion of copper may be effectively prevented by the barrier pattern. The copper structure including the copper pattern and the copper-manganese capping pattern covering the copper pattern may be formed on the barrier pattern. Thus, failures of the wiring structure caused by the diffusion of copper may decrease.

While example embodiments have been particularly shown and described, it will be understood by one of ordinary skill in the art that variations in form and detail may be made therein without departing from the spirit and scope of the claims.

What is claimed is:

1. A semiconductor device, comprising:
    a substrate;
    an insulating interlayer on an upper surface of the substrate, the insulating interlayer having a recess therein and including a low-k material having porosity;
    a damage curing layer on an entire inner surface of the recess without being in direct contact with the upper surface of the substrate;
    a barrier pattern on the damage curing layer; and
    a copper structure filling the recess having the barrier pattern therein, the copper structure including a copper pattern and a copper-manganese capping pattern covering a surface of the copper pattern,
    wherein the barrier pattern and the damage curing layer are formed of different materials; and
    wherein the copper-manganese capping pattern is formed on an upper surface and a sidewall of the copper pattern, the copper-manganese capping pattern enclosing the copper pattern.

2. The semiconductor device of claim 1,
    wherein the insulating interlayer includes Si—O bonds, and some oxygen atoms of the Si—O bonds in the insulating interlayer are substituted by a methyl group (CH3).

3. The semiconductor device of claim 1,
    wherein the damage curing layer has a porosity lower than a porosity of the insulating interlayer.

4. The semiconductor device of claim 1,
    wherein the damage curing layer includes an insulating material having Si—C bonds, and
    a density of the Si—C bonds in the damage curing layer is higher than a density of Si—C bonds in the insulating interlayer.

5. The semiconductor device of claim 1,
wherein a portion of the barrier pattern on a sidewall of the recess has a thickness less than a thickness of a portion of the barrier pattern on a bottom of the recess.

6. The semiconductor device of claim 1,
wherein the copper-manganese capping pattern has a thickness of about 0.1 nm to about 10 nm.

7. The semiconductor device of claim 1,
wherein a portion of the copper-manganese capping pattern on an upper central portion of the copper pattern has a first thickness, and a portion of the copper-manganese capping pattern on an upper edge portion of the copper pattern has a second thickness greater than the first thickness.

8. The semiconductor device of claim 1,
wherein the copper-manganese capping pattern is formed on an upper surface of the copper pattern.

9. The semiconductor device of claim 1,
wherein an amount of manganese in a portion of the copper-manganese capping pattern on the sidewall of the copper pattern is less than an amount of manganese in a portion of the copper-manganese capping pattern on the upper surface of the copper pattern.

10. A semiconductor device, comprising:
a substrate;
an insulating interlayer on an upper surface of the substrate, the insulating interlayer including a low-k material having porosity;
a recess disposed in the insulating interlayer, a bottom of the recess being disposed higher than the upper surface of the substrate and the bottom of the recess covering the upper surface of the substrate;
a barrier pattern on a sidewall of the recess and the bottom of the recess, a portion of the barrier pattern layer on the sidewall of the recess having a thickness less than a thickness of a portion of the barrier pattern on the bottom of the recess and the barrier pattern entirely covering the sidewall of the recess and the bottom of the recess;
a copper structure filling the recess having the barrier pattern therein, the copper structure including a copper pattern and a copper-manganese capping pattern covering a surface of the copper pattern; and
wherein the copper-manganese capping pattern is formed on an upper surface and a sidewall of the copper pattern, the copper-manganese capping pattern enclosing the copper pattern.

11. The semiconductor device of claim 10,
wherein the copper pattern includes manganese of 0.005 wt % to 5 wt %, and the copper-manganese capping pattern includes manganese having a weight percentage higher than a weight percentage of manganese in the copper pattern.

12. The semiconductor device of claim 11,
wherein the copper-manganese capping pattern includes manganese of 0.1 wt % to 80 wt %.

13. The semiconductor device of claim 10,
wherein the copper-manganese capping pattern is formed on an upper surface, a sidewall and a bottom of the copper pattern, and wherein a portion of the copper-manganese capping pattern on an upper central portion of the copper pattern has a first thickness, and a portion of the copper-manganese capping pattern on an upper edge portion of the copper pattern has a second thickness greater than the first thickness.

14. The semiconductor device of claim 10, further comprising a damage curing layer between the barrier pattern and the insulating interlayer, the damage curing layer having a porosity lower than a porosity of the insulating interlayer.

15. A semiconductor device, comprising:
a first insulating interlayer on a substrate, the first insulating interlayer having a via hole therethrough;
a second insulating interlayer including a low-k material having porosity and having a trench therethrough, the trench being in communication with the via hole and extending in a first direction;
a damage curing layer on inner surfaces of the via hole and the trench;
a barrier pattern on the damage curing layer, wherein the barrier pattern is formed of metal or metal nitride;
a copper structure on the barrier pattern to fill the via hole and the trench, the copper structure including a copper pattern and a copper-manganese capping pattern covering a surface of the copper pattern; and
wherein the copper-manganese capping pattern is formed on an upper surface and a sidewall of the copper pattern, the copper-manganese capping pattern enclosing the copper pattern.

16. The semiconductor device of claim 15,
wherein the damage curing layer has a porosity lower than porosities of the first and second insulating interlayers.

17. The semiconductor device of claim 15,
wherein the damage curing layer includes an insulating material having Si—C bonds, and a density of the Si—C bonds in the damage curing layer is higher than a density of Si—C bonds in each of the first and second insulating interlayers.

18. The semiconductor device of claim 15, wherein the copper-manganese capping pattern has a thickness of about 0.10 nm to about 10 nm.

19. The semiconductor device of claim 15,
wherein a portion of the copper-manganese capping pattern on an upper central portion of the copper pattern has a first thickness, and a portion of the copper-manganese capping pattern on an upper edge portion of the copper pattern has a second thickness greater than the first thickness.

* * * * *